(12) United States Patent
Yamada et al.

(10) Patent No.: US 7,839,156 B2
(45) Date of Patent: Nov. 23, 2010

(54) METHOD FOR DETECTING TIP POSITION OF PROBE, ALIGNMENT METHOD, APPARATUS FOR DETECTING TIP POSITION OF PROBE AND PROBE APPARATUS

(75) Inventors: Hiroshi Yamada, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 300 days.

(21) Appl. No.: 12/046,879

(22) Filed: Mar. 12, 2008

(65) Prior Publication Data
US 2008/0231300 A1    Sep. 25, 2008

(30) Foreign Application Priority Data
Mar. 23, 2007    (JP) .............................. 2007-077923

(51) Int. Cl.
*G01R 31/02* (2006.01)
(52) U.S. Cl. ....................... 324/758; 324/754
(58) Field of Classification Search .......... 324/754–765
See application file for complete search history.

(56) References Cited

U.S. PATENT DOCUMENTS

| | | | |
|---|---|---|---|
| 5,436,571 A * | 7/1995 | Karasawa ................... | 324/765 |
| 5,644,245 A * | 7/1997 | Saitoh et al. ................. | 324/754 |
| 5,773,987 A * | 6/1998 | Montoya ..................... | 324/757 |
| 6,842,023 B2 * | 1/2005 | Yoshida et al. ............... | 324/754 |
| 2004/0227535 A1 * | 11/2004 | Kobayashi et al. .......... | 324/758 |
| 2006/0097743 A1 * | 5/2006 | Komatsu ..................... | 324/765 |
| 2006/0267613 A1 * | 11/2006 | Takahashi et al. ........... | 324/758 |
| 2007/0164770 A1 * | 7/2007 | Casler et al. ................. | 324/765 |
| 2008/0238455 A1 * | 10/2008 | Ishii ........................... | 324/754 |

* cited by examiner

*Primary Examiner*—Ha Tran T Nguyen
*Assistant Examiner*—Arleen M Vazquez
(74) *Attorney, Agent, or Firm*—Oblon, Spivak, McClelland, Maier & Neustadt, L.L.P.

(57) ABSTRACT

An probe tip position detecting method detects tip positions of a plurality of probes by using a tip position detecting device including a sensor unit for detecting tips of the probes and a movable contact body belonging to the sensor unit, the method used in inspecting electrical characteristics of an object to be inspected by bringing the object supported on a movable mounting table into electrical contact with the probes. The method includes a first step for moving the tip position detecting device by using the mounting table to thereby bring the contact the object into contact with the tips of the probes; a second step for further moving the mounting table to thereby move the contact body toward the sensor unit without causing elastic deformation to the probes; and a third step of determining a movement starting position of the contact body as the tip positions of the probes.

20 Claims, 7 Drawing Sheets

METHOD FOR DETECTING TIP POSITION OF PROBE, ALIGNMENT METHOD, APPARATUS FOR DETECTING TIP POSITION OF PROBE AND PROBE APPARATUS

FIELD OF THE INVENTION

The present invention relates to a method for detecting tip positions of probes used in inspecting electrical characteristics of an object to be inspected such as a semiconductor wafer or the like, an alignment method and a tip position detecting apparatus and a probe apparatus and, more particularly, to a probe tip position detecting method, an alignment method, a tip position detecting apparatus and a probe apparatus capable of highly precisely detecting tip positions of a plurality of probes and consequently increasing inspection reliability.

BACKGROUND OF THE INVENTION

An electrical characteristics inspection of an object to be inspected such as a semiconductor wafer or the like is performed by, e.g., taking tip images of a plurality of probes provided in a probe card by a camera, detecting tip positions of the probes and contacting the probes with electrode pads of the object to be inspected. When detecting the tip positions of the probes with a camera, it takes time to focus the camera on the tip of the probe. As a result, much time is spent to align the object to be inspected and the probe card. For this reason, the alignment is not performed for all of the probes in usual cases but performed by, e.g., selecting several representative probes.

In case of the electrode pads being of a fine-size, however, there is a possibility that the probes may fail to make close contact with the respective electrode pads in their entirety. Therefore, it is desirable to detect the tip positions of all of the probes as far as possible. Further, the probe card suffers from variations in production quality, which variations are seldom avoidable even if the probe cards are of the same specification. This makes it necessary to detect the tips of the probes in more precise manner.

Further, since various kinds of probe cards are developed by different probe card makers, there is a need to develop card-specific algorithms for recognizing three-dimensional image of a plurality of probes. However, huge costs are incurred in developing the card-specific algorithms for the three-dimensional image. Therefore, by transferring the probes to a two-dimensional film, it is possible to develop the algorithms with ease.

For example, Japanese Patent Publication No. H5-067059 (JP-B-H5-067059) discloses a probing method for aligning probes and a wafer. In this method, the probe marks of probes are transferred to a wafer aligned on a table or a sheet attached to the table. The orientation of the wafer is compared with the orientation of the probes. The orientation of the table is corrected according to the result of comparison, whereby, the XY coordinates of a reference chip of the wafer are brought into coincidence with the XY coordinates of the probes.

Japanese Patent Laid-open Application No. 2005-079253 (JP-A-2005-079253) discloses a method for detecting a tip status of probes by using a transfer sheet. In this method, probe marks are left by bringing heat-expanded probes into pressure contact with a transfer sheet arranged in a transverse support base of a mounting table. After detecting the probe marks left in the transfer sheet, the heat-expanded probes are aligned in position with the wafer.

Japanese Patent Laid-open Application No. H2-224260 (JP-A-H2-224260) describes a position aligning method in which the direction and position of probes are recognized by leaving probe marks of probes in a dummy wafer and detecting the probe marks with a camera.

However, JP-B-H5-067059 has no description about the detection of tips of probes which is one of important alignment factors. In case of JP-A-2005-079253, the XY coordinate data of the probes are acquired by using the probe marks of the probes left in the transfer sheet. In order to detect the height of the tips, however, it is necessary to detect the depth of the probe marks, which makes it difficult to find the height of the needle points with increased precision. In case of JP-A-H2-224260, the tip positions of the probes are found by using the probe marks left in the dummy wafer. Therefore, it is possible to acquire the XY coordinate data of tips as in JP-A-2005-079253, but the Z coordinate data of tips is obtained by a camera with no alternative method.

SUMMARY OF THE INVENTION

In view of the above-noted problems, the present invention provides a method for detecting tip positions of probes, an alignment method, an apparatus for detecting tip positions of probes and a probe apparatus capable of highly precisely detecting tip positions of probes and increasing inspection reliability.

In accordance with a first aspect of the present invention, there is provided an probe tip position detecting method for detecting tip positions of a plurality of probes by using a tip position detecting device including a sensor unit for detecting tips of the probes and a movable contact body belonging to the sensor unit, the method used in inspecting electrical characteristics of an object to be inspected by bringing the object supported on a movable mounting table into electrical contact with the probes, the method including: a first step for moving the tip position detecting device through the mounting table to thereby bring the contact body into contact with the tips of the probes; a second step for further moving the mounting table to thereby move the contact body toward the sensor unit without causing elastic deformation to the probes; and a third step for determining a movement starting position of the contact body as the tip positions of the probes.

Further, the contact body is preferably designed to make contact with the probes via a soft member.

Further, the probes may cause no damage to the soft member in the second step.

Further, a current position of the contact body is preferably detected by a displacement sensor in the second step.

Further, the tip positions of the probes are preferably determined based on a detection result of the displacement sensor in the third step.

In accordance with a second aspect of the present invention, there is provided an alignment method for aligning an object and a plurality of probes by using an imaging unit for taking an image of the object and a tip position detecting device for detecting tips of the probes, the method used in inspecting electrical characteristics of the object to be inspected by bringing the object supported on a movable mounting table into electrical contact with the probes, the method including: detecting tip positions of the probes by using the tip position detecting device; transferring probe marks of the probes to a soft member attached to the tip position detecting device by bringing the soft member into contact with the probes; detecting the probe marks of the probes formed in the soft member by using the imaging unit;

and detecting contact positions of the object corresponding to the probes by using the imaging unit.

Preferably, the tip position detecting device is provided at the mounting table, the tip position detecting device including a sensor unit for detecting tips of the probes and a movable contact body belonging to the sensor unit, and wherein said detecting tip positions of the probes by using the tip position detecting device including: a first step for moving the tip position detecting device through the mounting table to thereby bring the contact body into contact with the tips of the probes; a second step for further moving the mounting table to thereby move the contact body toward the sensor unit without causing elastic deformation to the probes; and a third step for determining a movement starting position of the contact body as the tip positions of the probes.

Further, the probes may cause no damage to the soft member in the second step.

Further, a current position of the contact body is preferably detected by a displacement sensor in the second step.

Further, the tip positions of the probes are preferably determined based on a detection result of the displacement sensor in the third step.

In accordance with a third aspect of the present invention, there is provided a tip position detecting device for detecting tip positions of a plurality of probes when inspecting electrical characteristics of an object to be inspected by bringing the object into electrical contact with the probes, the device including: a sensor mechanism for detecting tips of the probes, wherein the sensor mechanism includes a sensor unit, a contact body movably attached to the sensor unit for making contact with the probes, and a pressure applying unit for applying a first pressure to the contact body to keep the contact body spaced apart from the sensor unit by a predetermined distance, wherein the tip positions of the probes are detected as the contact body makes contact with the probes and moves toward the sensor unit.

Further, the sensor mechanism may include a displacement sensor for detecting a current position of the contact body.

Further, when a second pressure which is greater than the first pressure is applied to the contact body, the contact body is preferably held against movement even if the contact body makes contact with the probes.

Further, preferably, the contact body includes a soft member detachably attached to the contact body and makes contact with the probes via the soft member.

Further, the soft member is preferably made of a material insusceptible to damage even when the contact body is moved by contacting with the probes under the first pressure.

Further, probe marks of the probe are preferably transferred to the soft member when the contact body makes contact with the probes under the second pressure.

In accordance with a fourth aspect of the present invention, there is provided a probe apparatus including: a movable mounting table for supporting an object to be inspected; a plurality of probes arranged above the mounting table; and a tip position detecting device provided at the mounting table for detecting tip positions of the probes, wherein the tip position detecting device includes a sensor mechanism for detecting tips of the probes, wherein the sensor mechanism includes a sensor unit, a contact body movably attached to the sensor unit for making contact with the probes, and a pressure applying unit for applying a first pressure to the contact body to keep the contact body spaced apart from the sensor unit by a predetermined distance, wherein the tip positions of the probes are detected as the contact body makes contact with the probes and moves toward the sensor unit.

Further, the sensor mechanism preferably includes a displacement sensor for detecting a current position of the contact body.

Further, when a second pressure which is greater than the first pressure is applied to the contact body, the contact body is preferably held against movement even if the contact body makes contact with the probes.

Further, preferably, the contact body includes a soft member detachably attached to the contact body and makes contact with the probes via the soft member.

Further, the soft member is preferably made of a material insusceptible to damage even when the contact body is moved by contacting with the probes under the first pressure.

Further, probe marks of the probes are preferably transferred to the soft member when the contact body makes contact with the probes under the second pressure.

In accordance with the present invention, it is possible to provide a method for detecting tip positions of probes, an alignment method, an apparatus for detecting tip positions of probes and a probe apparatus capable of highly precisely detecting tip positions of a plurality of probes and consequently increasing inspection reliability.

BRIEF DESCRIPTION OF THE DRAWINGS

The objects and features of the present invention will become apparent from the following description of embodiments given in conjunction with the accompanying drawings, in which:

FIGS. 5A and 5B are views extracted from steps shown in FIGS. 4B and 4C, wherein

DETAILED DESCRIPTION OF THE EMBODIMENTS

Hereinafter, embodiments of the present invention will be described with reference to FIGS. 1 to 6.

Figure 1:
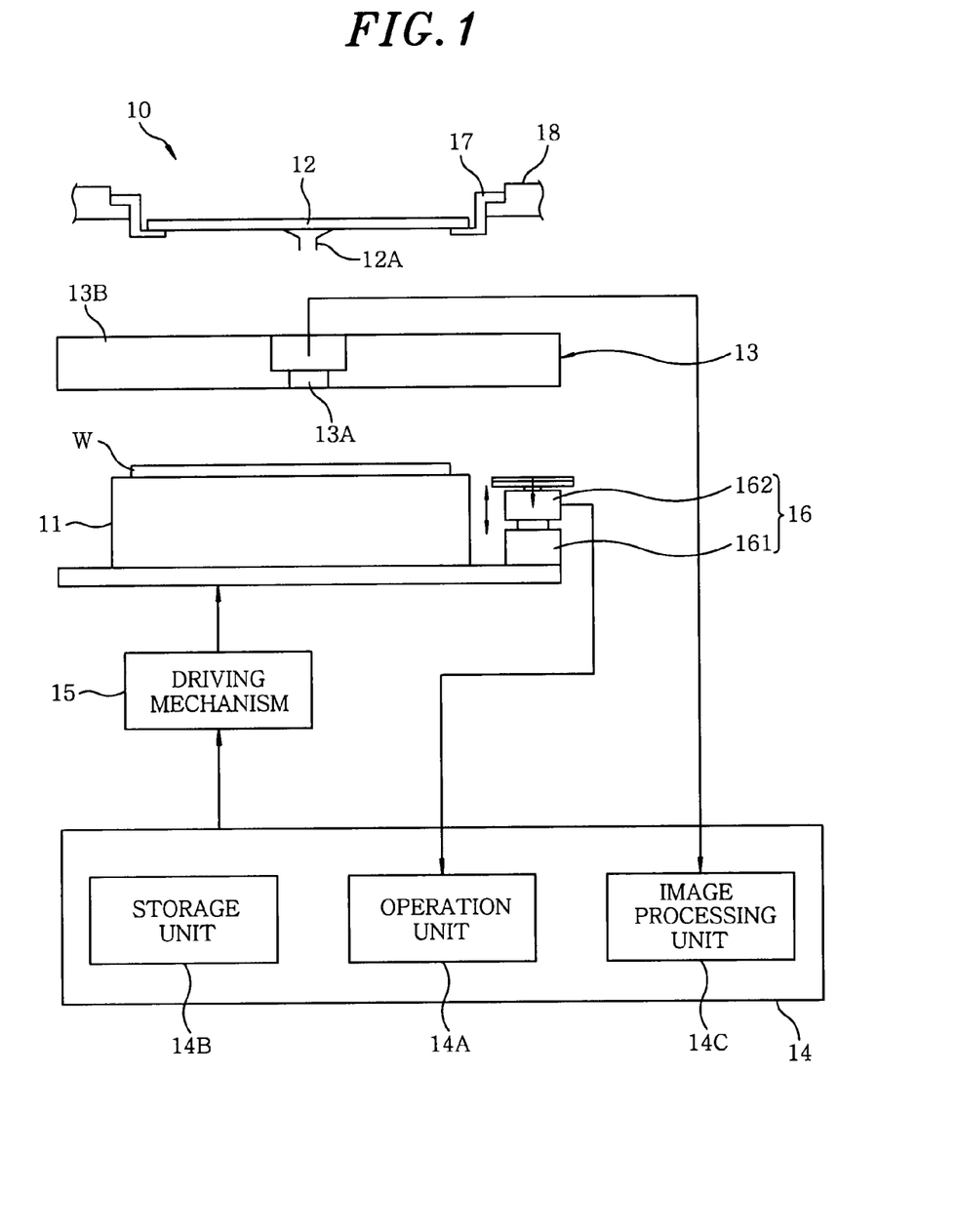
FIG. 1 is a configuration diagram showing a probe apparatus in accordance with an embodiment of the present invention.

First, a probe apparatus in accordance with an embodiment of the present invention will be described, e.g., with reference to FIG. 1. As shown in FIG. 1, the probe apparatus 10 of the present embodiment includes a movable wafer chuck 11 for mounting a semiconductor wafer W to be inspected thereon, a probe card 12 arranged above the wafer chuck 11, an alignment mechanism 13 for aligning a plurality of probes 12A of the probe card 12 with the semiconductor wafer W mounted on the wafer chuck 11, and a control unit 14 for controlling the wafer chuck 11, the alignment mechanism 13 and the like.

Under the control of the control unit 14, the alignment mechanism 13 is driven to align the semiconductor wafer W mounted on the wafer chuck 11 and the probes 12A of the probe card 12. Subsequently, electrical characteristics inspection of the semiconductor wafer W is conducted by brining the probes 12A into electrical contact with electrode pads of the semiconductor wafer W corresponding to the probes 12A.

The wafer chuck 11 is configured to move in X, Y, Z and Θ directions by means of a driving mechanism 15 operated under the control of the control unit 14. A tip position detecting device 16 of the present embodiment is arranged on one side of the wafer chuck 11. The tip position detecting device 16 is designed to detect tips of the probes 12A and is used in a tip position detecting method and an alignment method of the embodiment of the present invention which will be described later.

The probe card 12 is attached to a head plate 18 in a probe chamber via a card holder 17. In a state that the probes 12A are brought into electrical contact with the electrode pads of the semiconductor wafer W corresponding thereto, the probe card 12 performs electrical characteristics inspection of the semiconductor wafer W based on signals supplied from a tester (not shown).

Further, as illustrated in FIG. 1, the alignment mechanism 13 includes an imaging unit (CCD camera) 13A and an alignment bridge 13B for supporting the CCD camera 13a, the alignment bridge 13B being movable in reciprocatingly. Under the control of the control unit 14, the CCD camera 13a moves from a wait position to a position just below the center of the probe card 12 (hereinafter referred to as a "probe center") by means of the alignment bridge 13b. Then, the CCD camera 13A is stopped at that position. While the wafer chuck 11 is moved in the X and Y directions during an alignment process, the CCD camera 13A positioned at the probe center takes an image of the electrode pads of the semiconductor wafer W supported on the wafer chuck 11 from the top thereof. The taken image is processed in an image processing unit 14c and displayed on a display screen (not shown). As will be described later, the CCD camera 13A takes an image of the tip position detecting device 16 annexed to the wafer chuck 11. The image thus taken is processed and displayed on the display screen.

Further, as depicted in FIG. 1, the control unit 14 includes an operation unit 14A and a storage unit 14b as well as the image processing unit 14c mentioned above. The probe apparatus 10 is controlled by various programs stored in the storage unit 14B. A program for executing the probe tip position detecting method and the alignment method in accordance with the present invention is stored in the storage unit 14b. The probe tip position detecting method and the alignment method are executed by the program read from the storage unit 14B. Various data obtained at this time are stored in the storage unit 14B.

Figure 2:
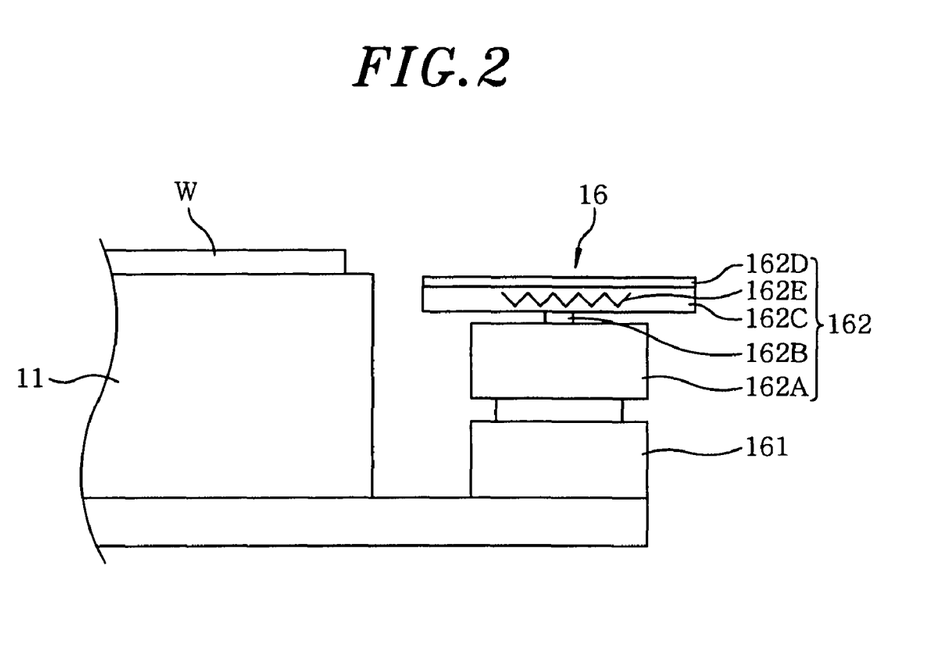
FIG. 2 is a side view illustrating a tip position detecting device employed in the probe apparatus shown in FIG. 1.

Referring to FIGS. 1 and 2, the tip position detecting device 16 in accordance with the embodiment of the present invention includes an elevation driving mechanism 161 such as an air cylinder or the like and a sensor mechanism 162 moved up and down by the elevation driving mechanism 161. When detecting the tip positions of the probes 12A, the elevation driving mechanism 161 raises up the sensor mechanism 162 from the wait position to a height substantially flush with the top surface of the semiconductor wafer W supported on the wafer chuck 11.

As shown in FIG. 2, the sensor mechanism 162 includes a sensor unit 162A including a cylinder mechanism and serving as a displacement sensor, a contact body 162C attached to the top end of a piston rod 162b included in the cylinder mechanism of the sensor unit 162A and kept in a position raised from the sensor unit 162A, a sheet-like soft member 162D detachably attached to a top surface of the contact body 162C, and a pressure applying unit (not shown), such as a compressed air source or the like, for supplying a compressed air into a cylinder belonging to the sensor unit 162a to apply a specified pressure to the contact body 162C through a piston (not shown) received within the cylinder.

Further, as shown in FIG. 2, a heater 162E is provided in the contact body 162c. The heater 162E is designed to heat and soften the soft member 162D, thereby eliminating the probe marks of the probes 12A transferred to the soft member 162d as described later. This makes it possible to use the soft member 162D repeatedly.

A fixing plate (not shown) is attached to the bottom end of the piston rod 162B. Through the fixing plate, the contact body 162C is resiliently held by the sensor unit 162A at all times in a raised position spaced apart from the sensor unit 162A at a predetermined distance. The gap left between the contact body 162C and the sensor unit 162A becomes a movable range of the contact body 162C. The distance of the gap is detected by the sensor unit 162A, whereby the position of the contact body 162C is monitored at all times by the sensor unit 162a.

The pressure applying unit is designed to switch over a first and a second pressure. The first pressure denotes a pressure which is set when detecting the tip positions of the probes 12A. The first pressure is set smaller than the second pressure. The second pressure refers to a pressure which is set when transferring the probe marks of the probes 12A to the top surface of the soft member 162D during an alignment process.

The sensor unit 162A is provided with a pressure regulating unit (not shown), such as a constant-pressure valve or the like, for keeping the first or second pressure constant. When the contact body 162C is moved down toward the sensor unit 162A, the pressure regulating unit gradually discharges the pressurized air to thereby keep the first pressure constant.

In a state that the contact body 162C is kept in place by the first pressure, the tip position detecting device 16 is raised up through the movement of the wafer chuck 11, whereby the contact body 162C makes contact with the probes 12A via the soft member 162D. At this time, the contact body 162C is moved down toward the sensor unit 162A while keeping the initial tip positions unchanged without elastic deformation of the probes 12A despite the contact with the contact body 162C.

In the state that the contact body 162C is kept in place by the first pressure, the probes 12A imparts a force of, e.g., 0.5 gf per probe, on the soft member 162D. The soft member 162D is made of a material having hardness great enough to ensure that the soft member 162D is kept free from damage even when the probes 12A makes contact with the soft member 162D at the first pressure and applies a probe pressure to the soft member 162D. Otherwise, the soft member 162D would be damaged by the sticking of the probes 12A into the soft member 162D or other causes. As the material for forming the soft member 162D, it is preferable to use a resin such as PO, PVC or the like.

In a state that the contact body 162C is kept at the second pressure, the contact body 162C is not moved down toward the sensor unit 162A but maintained in the initial position even if the probe pressure is applied to the soft member 162D by the probes 12A. Therefore, the probes 12A transfers probe marks to the top surface of the soft member 162D.

Next, the probe tip position detecting method and the alignment method in accordance with an embodiment of the present invention will be described with reference to FIGS. 3 to 6.

The probe tip position detecting method and the alignment method in accordance with the embodiment of the present embodiment are performed prior to inspecting electrical characteristics of the semiconductor wafer W. The probe tip position detecting method is carried out by the tip position detecting device 16 as a part of steps of the alignment method. When the tip positions of the probes 12A are detected by using the tip position detecting device 16, the sensor mechanism 162 is set at the first pressure.

First, the semiconductor wafer W is placed on the wafer chuck 11. The tip positions of the probes 12A of the probe card 12 are then detected by using the alignment mechanism 13 and the tip position detecting device 16. To this end, the CCD camera 13A of the alignment mechanism 13 is moved to the probe center, i.e., a position just below the center of the probe card 12, through the alignment bridge 13B. Next, during movement of the wafer chuck 11 under the alignment bridge 13B, the tip position detecting device 16 allows the elevation driving mechanism 161 to raise the sensor mechanism 162 as indicated by an arrow in FIG. 3B from the wait position illustrated in FIG. 3A. Thus, the top surface of the soft member 162D placed on the contact body 162C is made substantially flush with the top surface of the semiconductor wafer W supported on the wafer chuck 11.

Figure 3A:
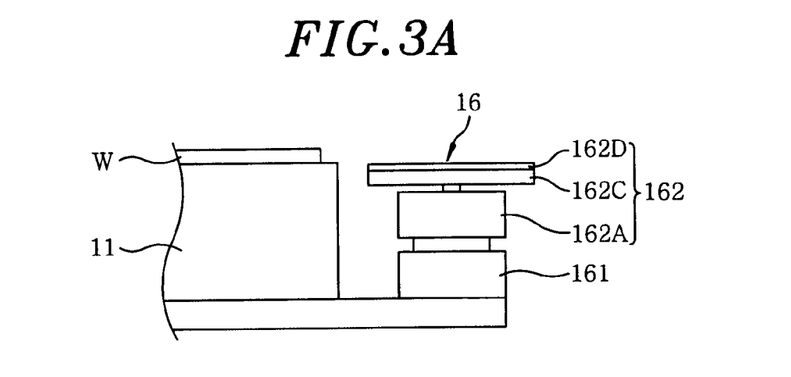
FIGS. 3A to 3C are process views showing, on a step-by-step basis, a probe tip position detecting method in accordance with the embodiment of the present invention.
Figure 3B:
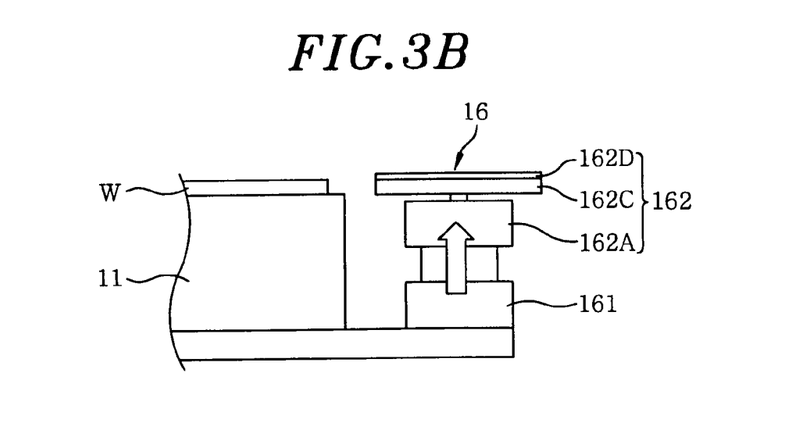
Figure 3C:
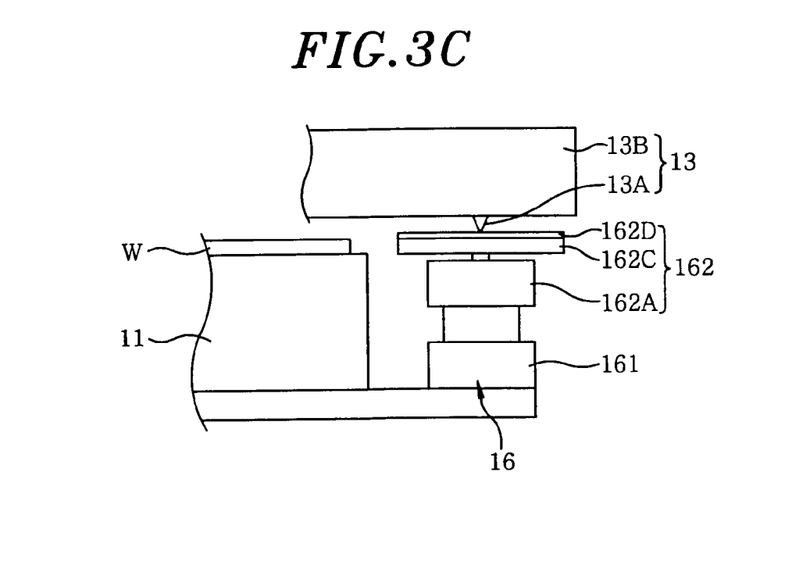

Thereafter, the wafer chuck 11 is moved in the X and Y directions, so that the contact body 162C reaches a position just below the CCD camera 13A as illustrated in FIG. 3C. Then, the CCD camera 13A detects the height of the top surface of the soft member 162D. After detecting the height of the top surface of the soft member 162D, it is confirmed whether the sensor mechanism 162 is normally operated, i.e., whether the contact body 162C is normally lowered to detect the tip positions. Also confirmed is the hardness of the soft member 162d. Once the normal operation of the sensor mechanism 162 is confirmed, the tip positions of the probes 12A are detected.

Figure 4A:
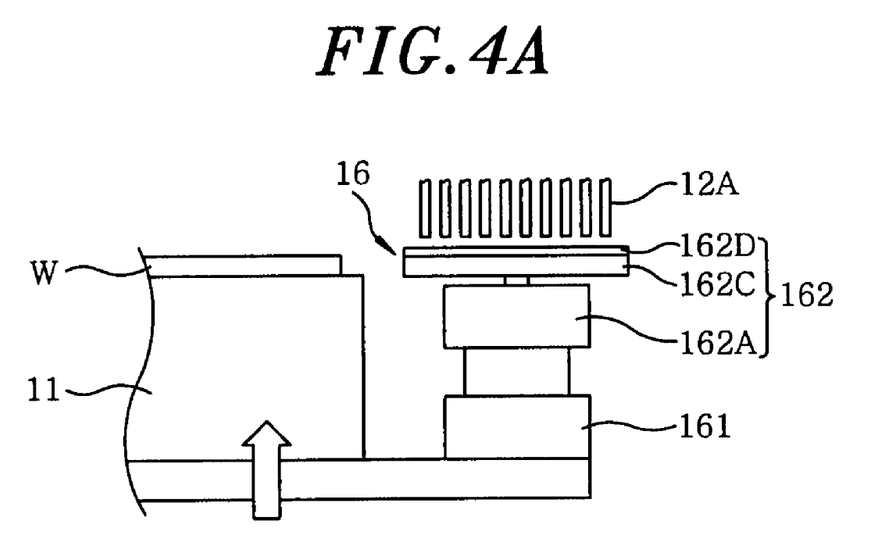
FIGS. 4A to 4D are process views showing, on a step-by-step basis, an alignment method in accordance with the embodiment of the present invention.
Figure 4B:
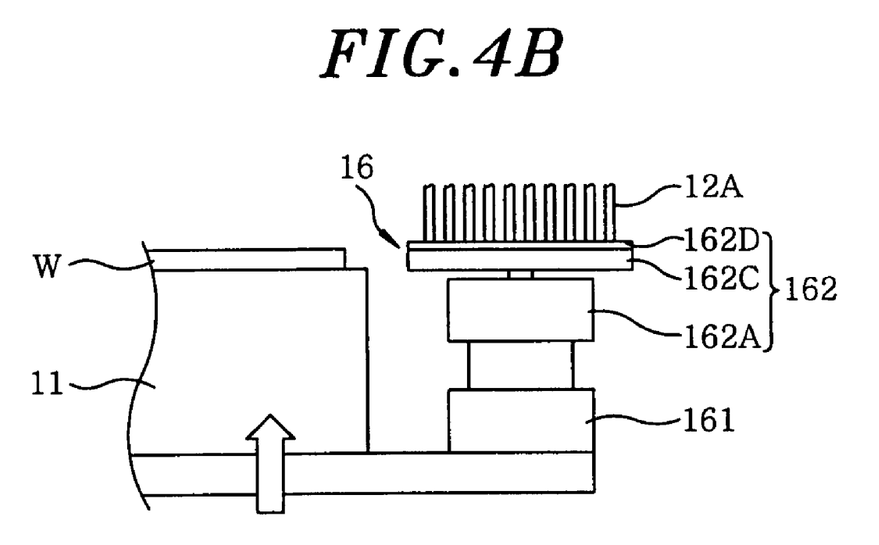

In order to detect the tip positions of the probes 12A, the alignment bridge 13B is first retracted to the wait position and then the wafer chuck 11 is moved up from the Z-direction reference position as shown in FIG. 4A. Then, the soft member 162D of the tip position detecting device 16 comes close to and makes contact with the probes 12A.

If the wafer chuck 11 further moves up, the contact body 162C is pressed by the probes 12A via the soft member 162D and moved down toward the sensor unit 162A. In other words, responsive to the upward movement of the wafer chuck 11, the contact body 162C moves down toward the sensor unit 162A by a distance corresponding to the upward movement of the wafer chuck 11 while being kept at the first pressure, thereby reducing the gap between the sensor unit 162A and the contact body 162C. At this time, the contact body 162C is resiliently held in position under the first pressure. Therefore, despite the probe pressure acting between the probes 12A and the soft member 162D, the probes 12A do not undergo elastic deformation nor do they cause damage to the soft member 162D (nor do they transfer the probe marks to the soft member 162D).

In this process, the sensor unit 162A monitors the distance between itself and the contact body 162C. If the gap between the sensor unit 162A and the contact body 162C is changed by the downward movement of the contact body 162C, the sensor unit 162A detects the length of the gap and transmits a detection signal to the control unit 14. In response, the control unit 14 compares the value detected by the sensor unit 162A with an initial gap value preset in the operation unit 14A.

Based on the upward movement distance from the reference position of the wafer chuck 11 until the moment when the detection value becomes equal to or smaller than the initial value, the control unit 14 calculates the height of the top surface of the soft member 162D, i.e., the height of the tip positions of the probes 12A. In this way, the contact body 162C begins to move down with no elastic deformation of the probes 12A and without causing damage to the soft member 162D. Therefore, it is possible to highly accurately detect the downward movement starting position of the contact body 162C as the tip height of the probes 12A. The tip height of the probes 12A detected is stored in the storage unit 14B of the control unit 14 as Z-coordinate data.

Figure 5A:
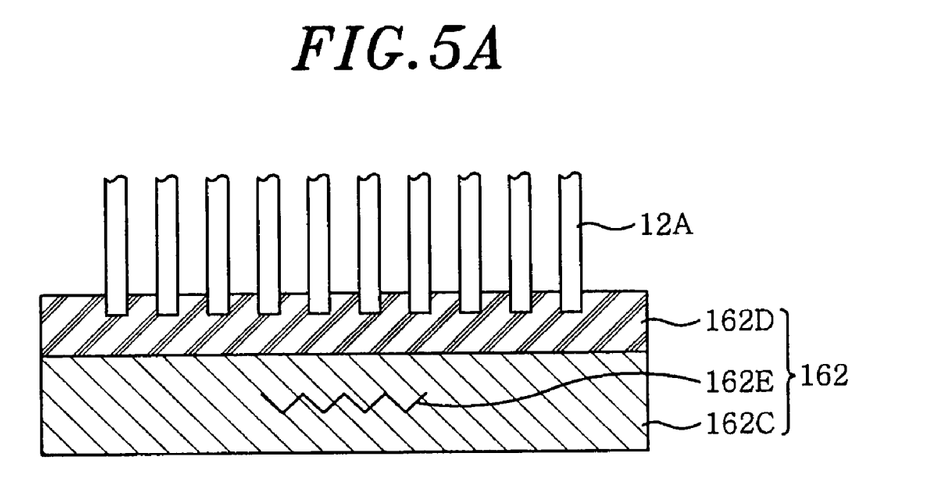
FIG. 5A is a cross sectional view illustrating a probe mark forming step corresponding to FIG. 4B
Figure 5B:
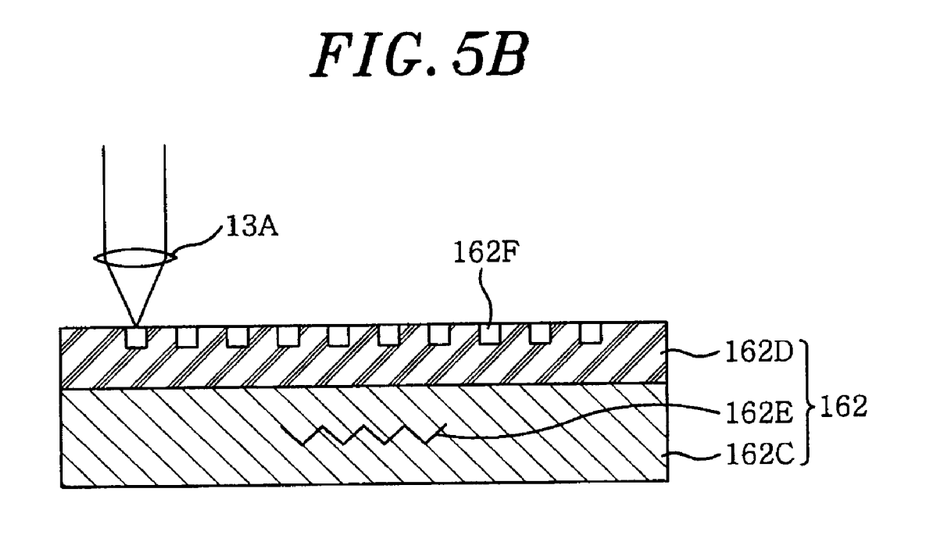
FIG. 5B is a cross sectional view illustrating a step for detecting XY coordinates of probe marks corresponding to FIG. 4C.

Subsequently, the wafer chuck 11 is returned to the Z-direction reference position. Thereafter, the pressure applied to the contact body 162C is switched over from the first pressure to the second pressure. As indicated by an arrow in FIG. 4B, the wafer chuck 11 is moved up once again to bring the soft member 162D into contact with the probes 12A and is then overdriven. Even if the wafer chuck 11 is overdriven, the contact body 162C stays in its initial position with respect to the sensor unit 162A without moving down toward the sensor unit 162A. This is because the contact body 162C is kept under the second pressure. As can be seen in FIG. 5A, the probes 12A is stuck into the soft member 162D so that probe marks 162f can be transferred to the top surface of the soft member 162D as illustrated in FIG. 5B.

Further, there is an alternative method for forming the probe marks 162f on the top surface of the soft member 162D. For example, it is possible to form the probe marks 162f in the soft member 162D by switching the first pressure to the second pressure and returning the contact body 162C to the initial position in the state that the tip height of the probes 12A is detected.

Figure 4C:
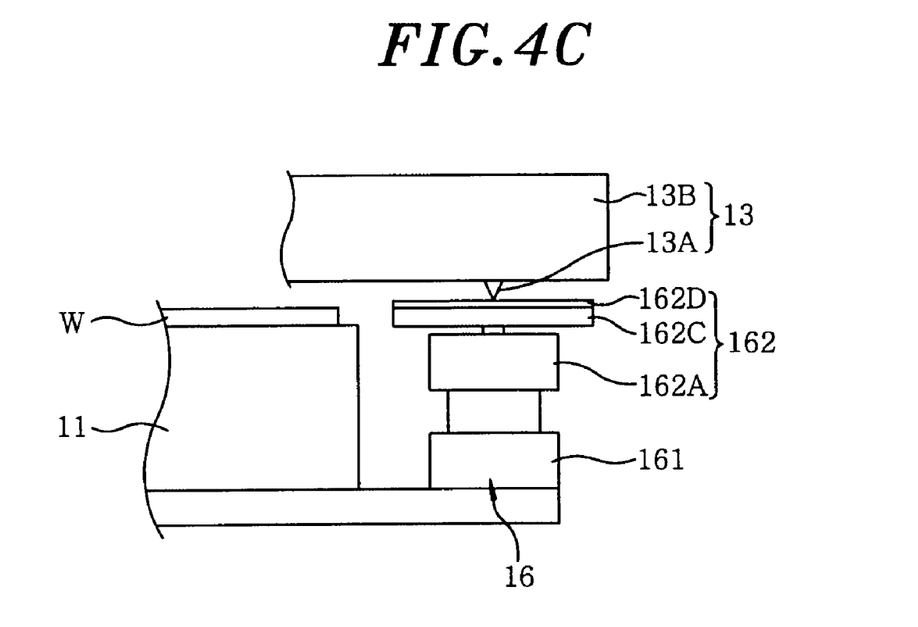

After the probe marks 162f are transferred to the soft member 162D in the above-noted manner, the wafer chuck 11 is moved down to the reference position. Then, the CCD camera 13A is moved to the probe center by the alignment bridge 13B, after which the wafer chuck 11 is raised from the reference position. As illustrated in FIGS. 4C and 5B, the CCD camera 13A detects the probe marks 162f left in the soft member 162D. By doing so, it is possible to detect some XY positions or, if necessary, all of the XY positions of the probes 12A. The XY-coordinate data thus obtained is stored in the storage unit 14B. The tip positions, i.e., the XYZ-coordinate data, of the probes 12A are acquired through the series of operations describe above and used in aligning the semiconductor wafer W and the probes 12A.

Figure 4D:
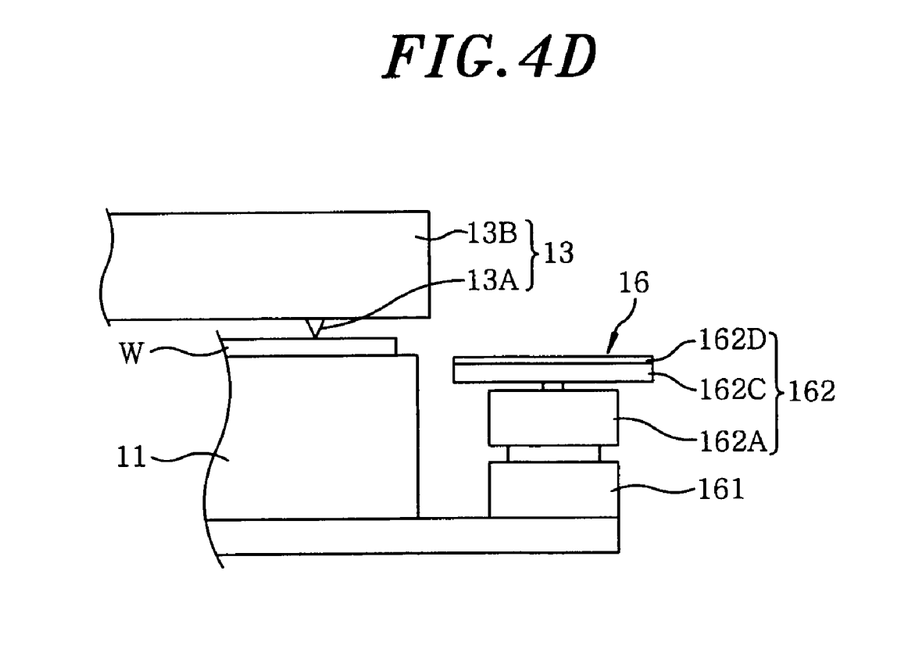
Figure 6:
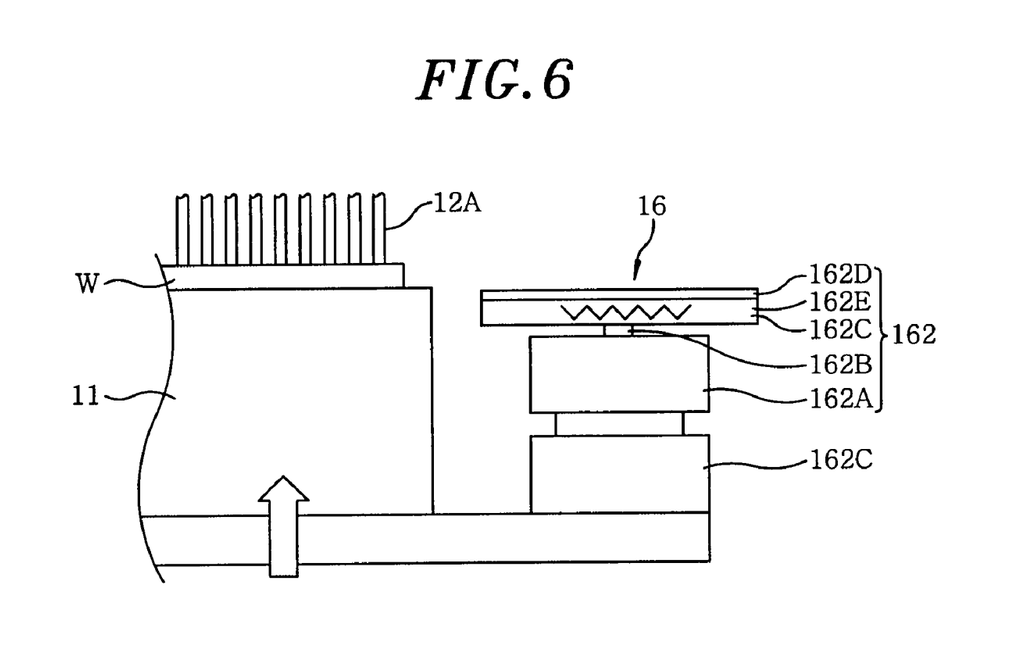
FIG. 6 is a process view illustrating a last step of the alignment method shown in FIGS. 4A to 4D.

When performing alignment, the wafer chuck 11 is moved in the X and Y directions. As illustrated in FIG. 4D, the CCD camera 13A detects the electrode pads corresponding to the probes 12A in a plurality of locations on the semiconductor wafer W. The XY-coordinate data of the respective electrode pads are stored in the storage unit 14B. The task of aligning the probes 12A with the electrode pads of the semiconductor wafer W is terminated through the series of operations noted above. After terminating the alignment, the wafer chuck 11 is moved to an inspection startup position and raised up at that position. Then, electrical characteristics are inspected by bringing the plurality of electrode pads of a first chip into contact with the probes 12A corresponding thereto, as shown in FIG. 6. Next, electrical characteristics are inspected for all of the remaining chips of the semiconductor wafer W by index-feeding the semiconductor wafer W by the wafer chuck 11.

As described above, in accordance with the embodiment of the present invention, the tip positions of the probes 12A are detected by use of the tip position detecting device 16 annexed to the wafer chuck 11. The tip position detecting device 16 includes the sensor mechanism 162 for detecting the tip positions of the probes 12A and the vertically movable contact body 162C belonging to the sensor mechanism 162. The tip position detecting device 16 moves up from the Z-direction reference position by the movement of the wafer chuck 11 so that the soft member 162D placed on the contact body 162C makes contact with the tips of the probes 12A.

Then, by the further upward movement of the wafer chuck 11, the contact body 162C moves down toward the sensor unit 162A without causing elastic deformation to the probes 12A. The initial downward movement position of the contact body 162C is determined to be the tip positions of the probes 12A. Therefore, in a state that the tips of the probes 12A stay in the initial position, it is possible to highly accurately detect the tip height without the disadvantages of using a camera as in a conventional case. Regardless of the types of the probes 12A, it is possible to reliably detect the tip height thereof.

Further, in accordance with the embodiment of the present invention, the contact body 162C makes contact with the probes 12A via the soft member 162D, and the contact body 162C is moved down toward the sensor part 162A without causing damage to the soft member 162. Therefore, it is possible to highly accurately detect the tip height of the probes 12A without changing the tip height from the initial position. At this time, the downward movement of the contact body 162C is detected by the sensor unit 162A, which makes it possible to detect the tip height with further increased accuracy.

Further, during the alignment, the contact body 162C is kept in the initial position with respect to the sensor unit 162A under a pressure higher than the pressure for detecting the tip positions. Therefore, it is possible to reliably transfer the probe marks 162f of all of the probes 12A to the top surface of the soft member 162D by bringing the probes 12A into contact with the soft member 162D. Since the probe marks 162f of the probes 12A are all transferred to the soft member 162D in this manner, it is possible to acquire the XY-coordinate data of the probes 12A based on the probe marks 162f of some of the probes 12A or, if necessary, all of the probes 12A. This makes it possible to accurately align the XY-coordinate data of the probes 12A with the XY-coordinate data of the corresponding electrode pads.

Therefore, inspection can be performed in a highly reliable manner by accurately bringing some or, if necessary, all of the probes 12A into contact with the electrode pads corresponding thereto. Owing to the fact that the needle points of the probes 12A are transferred to the soft member 162D in the alignment process, there is no need to use a camera-based complex algorithm employed in conventional case. This makes it possible to save the costs involved in developing software. In addition, there is no need to use a probe-detecting CCD camera in the alignment process, which makes it possible to reduce the manufacturing costs of the alignment mechanism 13.

The present invention is not limited to the embodiments described above. Each of the components may be arbitrarily changed or modified if such a need arises. For example, in the present embodiment described above, a length measuring device such as a capacitance sensor, a laser length measuring device or the like may be used as the sensor unit for detecting the displacement of the contact body.

The present invention can be suitably used in a probe apparatus for inspecting the electrical characteristics of an object to be inspected such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. A probe tip position detecting method for detecting tip positions of a plurality of probes by using a tip position detecting device including a sensor unit for detecting tips of the probes and a movable contact body attached to the sensor unit, the method being used in inspecting electrical characteristics of an object to be inspected by bringing the object supported on a movable mounting table into electrical contact with the probes, the method comprising: a first step of moving the tip position detecting device through the mounting table to thereby bring the contact body into contact with the tips of the probes; a second step of further moving the mounting table to thereby move the contact body toward the sensor unit without causing elastic deformation to the probes; and a third step of determining a movement starting position of the contact body as the tip positions of the probes, wherein the sensor unit constantly applies a first pressure to the contact body in the second step, and wherein the contact body moves towards the sensor unit upon contact with the probes so as to maintain the first pressure constant.

2. The method of claim 1, wherein the contact body is designed to make contact with the probes via a soft member, and
wherein the probes cause no damage to the soft member in the second step.

3. The method of claim 1, wherein a distance between the sensor unit and the contact body is detected by the sensor unit in the second step.

4. The method of claim 3, wherein, in the third step, the tip positions of the probes are determined based on a detection result of the sensor unit.

5. An alignment method for aligning an object to be inspected and a plurality of probes by using an imaging unit for taking an image of the object and a tip position detecting device for detecting tips of the probes, the method being used in inspecting electrical characteristics of the object by bringing the object supported on a movable mounting table into electrical contact with the probes, the method comprising:
detecting tip positions of the probes by using the tip position detecting device;
transferring probe marks of the probes to a soft member attached to the tip position detecting device by bringing the soft member into contact with the probes;
detecting the probe marks of the probes formed in the soft member by using the imaging unit; and
detecting contact positions of the object corresponding to the probes by using the imaging unit,
wherein the tip position detecting device is provided at the mounting table, and
wherein, the detecting the tip positions of the probes is executed by using the method of claim 1.

6. The method of claim 5, wherein the probes cause no damage to the soft member in the second step.

7. The method of claim 5, wherein the sensor unit constantly applies a first pressure to the contact body in the second step, and wherein the contact body moves towards the sensor unit upon contact with the probes so as to maintain the first pressure constant.

8. The method of claim 7, wherein a distance between the sensor unit and the contact body is detected by the sensor unit in the second step.

9. The method of claim 8, wherein, in the third step, the tip positions of the probes are determined based on a detection result of the sensor unit.

10. The apparatus of claim 5, wherein the contact body includes a heater to heat the soft member, thereby eliminating the probe marks of the probes transferred thereon to allow the soft member to be reused.

11. A tip position detecting device for detecting tip positions of a plurality of probes when inspecting electrical characteristics of an object to be inspected by bringing the object into electrical contact with the probes, the device comprising:
 a sensor mechanism for detecting tips of the probes,
 wherein the sensor mechanism includes a sensor unit and a contact body movably attached to the sensor unit for making contact with the probes,
 wherein the sensor unit applies a first pressure to the contact body to keep the contact body spaced apart from the sensor unit by a predetermined distance before the contact body is in contact with the probes, and
 wherein the tip positions of the probes are detected by a movement of the contact body towards the sensor unit while the contact body is in contact with the probes and the first pressure is constantly applied thereto.

12. The device of claim 11, wherein the sensor unit serves to detect a distance between the sensor unit and the contact body.

13. The device of claim 11, wherein, when the sensor unit applies a second pressure to the contact body which is greater than the first pressure, the contact body is held against movement even if the contact body makes contact with the probes,
 wherein the contact body includes a soft member detachably attached thereto and makes contact with the probes via the soft member, and
 wherein the soft member is made of a material insusceptible to damage even when the contact body is moved by contacting with the probes under the first pressure.

14. The device of claim 13, wherein probe marks of the probe are transferred to the soft member when the contact body makes contact with the probes under the second pressure.

15. The apparatus of claim 14, wherein the contact body includes a heater to heat the soft member, thereby eliminating the probe marks of the probes transferred thereon to allow the soft member to be reused.

16. A probe apparatus comprising: a movable mounting table for supporting an object to be inspected; a plurality of probes arranged above the mounting table; and a tip position detecting device provided at the mounting table for detecting tip positions of the probes,
 wherein the tip position detecting device includes a sensor mechanism for detecting tips of the probes,
 wherein the sensor mechanism includes a sensor unit and a contact body movably attached to the sensor unit for making contact with the probes,
 wherein the sensor unit applies a first pressure to the contact body to keep the contact body spaced apart from the sensor unit by a predetermined distance before the contact body is in contact with the probes, and
 wherein the tip positions of the probes are detected by a movement of the contact body towards the sensor unit while the contact body is in contact with the probes and the first pressure is constantly applied thereto.

17. The apparatus of claim 16, wherein the sensor unit serves to detect a distance between the sensor unit and the contact body.

18. The apparatus of claim 16, wherein, when the sensor unit applies a second pressure to the contact body which is greater than the first pressure, the contact body is held against movement even if the contact body makes contact with the probes,
 wherein the contact body includes a soft member detachably attached thereto and makes contact with the probes via the soft member, and
 wherein the soft member is made of a material insusceptible to damage even when the contact body is moved by contacting with the probes under the first pressure.

19. The apparatus of claim 18, wherein probe marks of the probes are transferred to the soft member when the contact body makes contact with the probes under the second pressure.

20. The apparatus of claim 19, wherein the contact body includes a heater to heat the soft member, thereby eliminating the probe marks of the probes transferred thereon to allow the soft member to be reused.

* * * * *